(12) United States Patent
Chang et al.

(10) Patent No.: US 11,068,091 B2
(45) Date of Patent: Jul. 20, 2021

(54) TOUCH PANEL AND MANUFACTURING METHOD THEREOF

(71) Applicant: TPK Glass Solutions (Xiamen) Inc., Xiamen (CN)

(72) Inventors: Chen-Hsin Chang, Taoyuan (TW); Chia-Hao Hsu, Taipei (TW); Shan-Yu Wu, New Taipei (TW)

(73) Assignee: TPK Glass Solutions (Xiamen) Inc., Xiamen (CN)

( * ) Notice: Subject to any disclaimer, the term of this patent is extended or adjusted under 35 U.S.C. 154(b) by 104 days.

(21) Appl. No.: 16/454,371

(22) Filed: Jun. 27, 2019

(65) Prior Publication Data
US 2020/0012372 A1   Jan. 9, 2020

(30) Foreign Application Priority Data

Jul. 4, 2018   (CN) .......................... 201810724599.1

(51) Int. Cl.
*G06F 3/041*   (2006.01)
*G03F 7/16*   (2006.01)
*G03F 7/20*   (2006.01)
*G03F 7/32*   (2006.01)

(52) U.S. Cl.
CPC ............. *G06F 3/0412* (2013.01); *G03F 7/16* (2013.01); *G03F 7/2002* (2013.01); *G03F 7/32* (2013.01); *G06F 2203/04103* (2013.01)

(58) Field of Classification Search
CPC ........ G03F 7/0952; G03F 7/16; G03F 7/2002; G03F 7/32; G06F 2203/04103; G06F 3/0412; G06F 3/04164; G06F 3/044
See application file for complete search history.

(56) References Cited

U.S. PATENT DOCUMENTS

| | | | |
|---|---|---|---|
| 2005/0153107 A1* | 7/2005 | Iijima | B32B 17/10174 428/195.1 |
| 2015/0220202 A1* | 8/2015 | Choung | G06F 3/0446 345/174 |
| 2016/0246415 A1* | 8/2016 | Bae | G06F 3/0445 |
| 2018/0196561 A1* | 7/2018 | Kim | G06F 3/0445 |

* cited by examiner

*Primary Examiner* — Afroza Chowdhury
(74) *Attorney, Agent, or Firm* — Idea Intellectual Limited; Margaret A. Burke; Sam T. Yip

(57) ABSTRACT

A touch panel includes a substrate, a photosensitive layer, a metal nanowire layer and a photosensitive conductive layer. The metal nanowire layer and the photosensitive layer are formed on a display area and a peripheral area of the substrate. The photosensitive conductive layer is formed on the metal nanowire layer on the peripheral area. A removal region and a reserved region of both the photosensitive conductive layer and the photosensitive layer are defined by an exposure process. At the display area, the photosensitive layer and the metal nanowire layer in the removal region are removed by a developer to form a touch sensing electrode. At the peripheral area, the photosensitive conductive layer, the photosensitive layer and the metal nanowire layer in the removal region are removed by a developer to form a peripheral conductive trace. The touch sensing electrode is electrically connected to the peripheral conductive trace.

20 Claims, 11 Drawing Sheets

TOUCH PANEL AND MANUFACTURING METHOD THEREOF

CROSS-REFERENCE TO RELATED APPLICATION

This application claims priority to China Application Serial Number 201810724599.1, filed Jul. 4, 2018, which is herein incorporated by reference.

BACKGROUND

Field of Disclosure

The present disclosure relates to a touch panel and a method of manufacturing thereof.

Description of Related Art

Since a transparent conductor can have both light transmittance and appropriate conductivity, it is often used in many display or touch related devices. In the conventional technology, a transparent conductor can be made of a thin film of metal oxide, such as indium tin oxide (ITO), indium zinc oxide (IZO), cadmium tin oxide, (CTO), or aluminum-doped zinc oxide (AZO). In some cases, some problems can be easily observed on the patterned metal oxide film. In addition, metal oxide films are not flexible. Therefore, a variety of transparent conductors have been proposed, such as transparent conductors made of nanowires, etc.

However, when using nanowires in the manufacturing of touch electrodes, there are many unsolved problems related to the process and the structure of the nanowires and the metal leads of the peripheral area. For example, in the conventional process, nanowires are coated on the display area and the peripheral area and cover the metal lead of the peripheral area. The nanowires are then patterned by using an etchant to fabricate a touch sensing electrode in the display area. The etchant used in the above process is primarily strong acid, such that the metal lead is attacked by the etchant, thereby reducing the reliability of the product. Moreover, an additional cleaning process is required to overcome the residual problem of the etchant. In addition, since the patterning of the nanowire layer and the metal lead requires two photolithography and etching processes, the overall process is complicated. Furthermore, the touch sensing electrode and the metal lead need to be aligned. Therefore, there is a need to reserve an alignment deviation region, such that the touch panel's frame cannot be downsized and thereby fails to meet the requirement of a narrow frame.

In addition, the excessively high contact impedance between the nanowire layer and the metal lead wire also affects the performance of the touch panel.

Therefore, in the process of using nanowires in the manufacturing a touch sensing electrode, the electrode structure must be redesigned according to the material characteristics to achieve better performance of the product.

SUMMARY

In some embodiments of the present disclosure, the process efficiency of the touch panel can be increased, and the touch panel has low impedance/resistance characteristics.

In some embodiments of the present disclosure, a method of manufacturing a touch panel is proposed. The method includes providing a substrate having a display area and a peripheral area; disposing a metal nanowire layer comprising a plurality of metal nanowires in the display area and the peripheral area; disposing a photosensitive layer on the metal nanowire layer; disposing a photosensitive conductive layer in the peripheral area, in which the photosensitive conductive layer is disposed on the metal nanowire layer; and performing a photolithography step. The photolithography step includes exposing the photosensitive layer and the photosensitive conductive layer to define a removal region and a reserved region; and removing the photosensitive layer and the metal nanowire layer in the removal region by using a developer to fabricate a touch sensing electrode on the display area; and meanwhile removing the photosensitive conductive layer, the photosensitive layer, and the metal nanowire layer in the removal region by using the developer to fabricate a peripheral conductive trace on the peripheral area, the touch sensing electrode electrically connecting the peripheral conductive trace. The touch sensing electrode comprises the photosensitive layer and the metal nanowire layer.

In some embodiments of the present disclosure, the photosensitive conductive layer comprises a silver paste with negative photosensitivity.

In some embodiments of the present disclosure, the method further comprises a curing step of the silver paste.

In some embodiments of the present disclosure, the photosensitive layer and the photosensitive conductive layer comprise materials having the same or similar optical band absorption characteristics, and the step of exposing the photosensitive layer and the photosensitive conductive layer includes using an exposure light source to simultaneously emit light onto the photosensitive layer and the photosensitive conductive layer.

In some embodiments of the present disclosure, the method further comprises using an adhesive tape to remove the metal nanowires in the removal region.

In some embodiments of the present disclosure, the metal nanowires are exposed from the photosensitive layer. At least a portion of the metal nanowires protrudes out of the photosensitive layer.

In some embodiments of the present disclosure, a touch panel is proposed. The touch panel comprises a substrate having a display area and a peripheral area; a photosensitive layer and a metal nanowire layer disposed on the substrate; and a photosensitive conductive layer disposed on the peripheral area, in which a removal region and a reserved region are defined on the photosensitive conductive layer and the photosensitive layer after an exposure, in which, in the display area, the photosensitive layer and the metal nanowire layer in the removal region are removed by a developer, such that a touch sensing electrode is defined in the display area, while in the peripheral area, the photosensitive conductive layer, the photosensitive layer, and the metal nanowire layer in the removal region are removed by the developer, such that a peripheral conductive trace is defined in the peripheral area, and the touch sensing electrode is electrically connected to the peripheral conductive trace.

In some embodiments of the present disclosure, the metal nanowire layer comprises a plurality of metal nanowires, and the metal nanowires are embedded in the photosensitive layer in the reserved region and form a conductive network, whereas the photosensitive layer and the metal nanowires located in the display area collectively form the touch sensing electrode.

In some embodiments of the present disclosure, the photosensitive conductive layer comprises a silver paste with negative photosensitivity.

In some embodiments of the present disclosure, the photosensitive layer and the photosensitive conductive layer comprise materials having the same or similar optical band absorption characteristics.

According to some embodiments of the present disclosure, the metal nanowire layer comprises metal nanowires exposed from the photosensitive layer. At least a portion of the metal nanowires protrudes out of the photosensitive layer.

In some embodiments of the present disclosure, a non-conductive area is located between the touch sensing electrode and another touch sensing electrode, and a concentration of metal nanowire in the non-conductive area is zero.

In some embodiments of the present disclosure, a non-conductive area is located between the peripheral conductive trace and another peripheral conductive trace, and a concentration of metal nanowire in the non-conductive area is zero.

In some embodiments of the present disclosure, a non-conductive area is located between the touch sensing electrode and another touch sensing electrode, and a concentration of metal nanowire in the non-conductive area is less than a percolation threshold, such that the metal nanowires in the non-conductive area form a non-conductive network.

In some embodiments of the present disclosure, a non-conductive area is located between the peripheral conductive trace and another peripheral conductive trace, and a concentration of metal nanowire of the non-conductive area is less than a percolation threshold, such that the metal nanowires in the non-conductive area form a non-conductive network.

In some embodiments of the present disclosure, the touch sensing electrode has an exposed sidewall.

In some embodiments of the present disclosure, the peripheral conductive trace is disposed on a composite structure of the photosensitive layer and the metal nanowire layer, the peripheral conductive trace has a first exposed sidewall, the composite structure has a second exposed sidewall, and the first exposed sidewall is aligned with the second exposed sidewall to form a coplanar plane.

DETAILED DESCRIPTION

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present disclosure. Furthermore, for simplifying the drawings, some of the conventional structures and elements are shown with schematic illustrations.

As used herein, the terms "about" or "roughly" are generally an error or range of index values within 20%, preferably within 10%, more preferably within 5%. If not stated in the text, the numeric values mentioned are regarded as approximations, that is, they have errors or ranges as expressed by "about" or "roughly". Moreover, the terms "pattern," "design," and "graphic" as used herein are the same or similar concepts and may be used interchangeably below for convenience of explanation. Similarly, "metal nano-wires" and "metal nanowire layer" are also the same or similar elements, which will be used interchangeably below, which are hereby explained.

Figure 1:
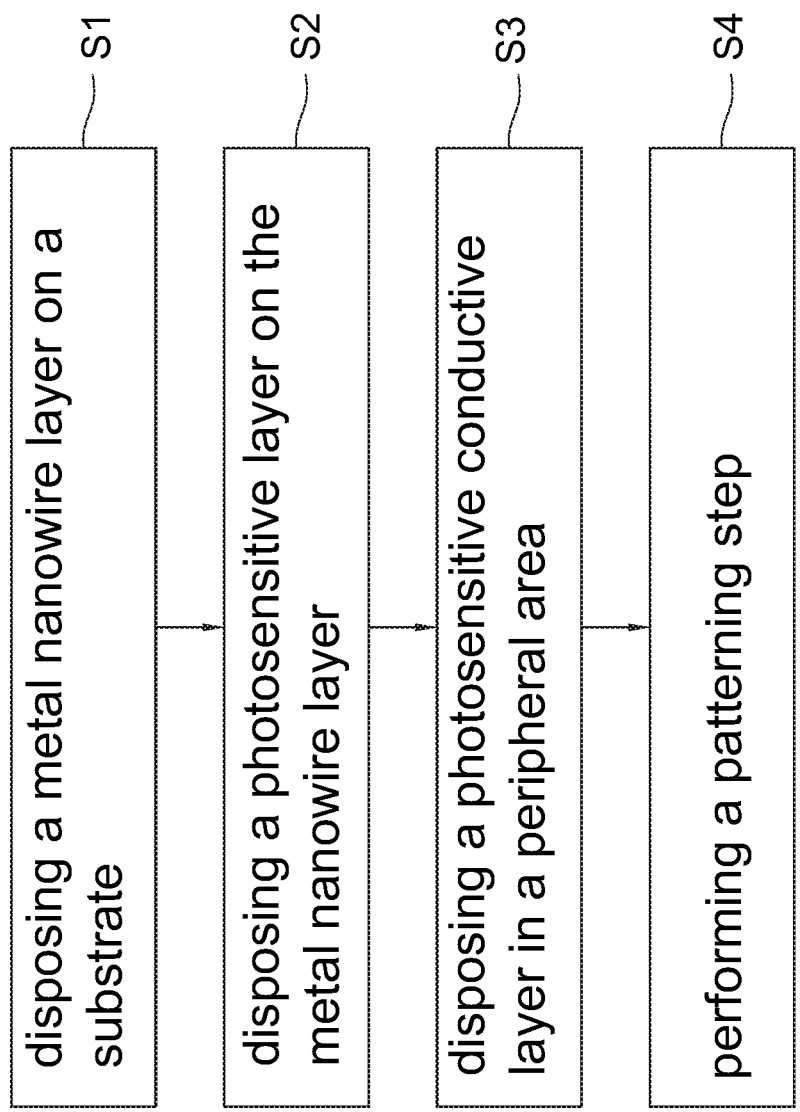
FIG. 1 is a flow chart of a method of manufacturing touch panel according to some embodiments of the present disclosure.
Figure 2:
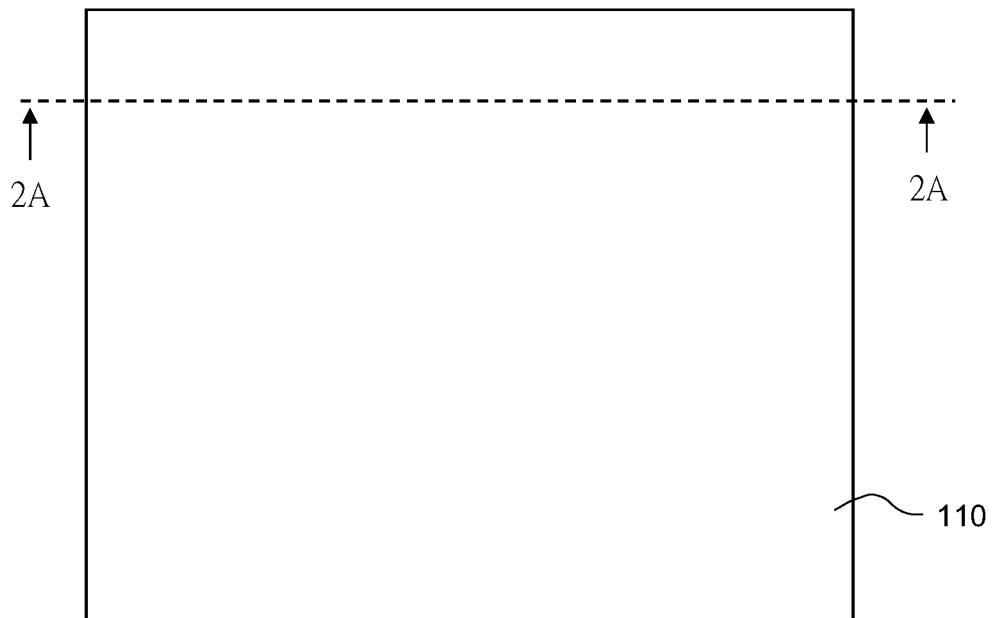
FIG. 2 is a schematic top view of a substrate according to some embodiments of the present disclosure.
Figure 2A:
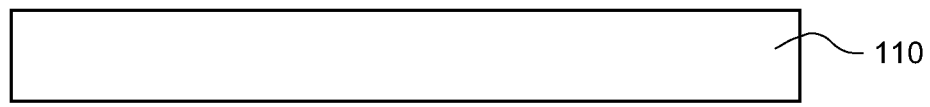
FIG. 2A is a schematic sectional view along line 2A-2A in FIG. 2.

FIG. 1 is a flow chart of a method of manufacturing touch panel according to some embodiments of the present disclosure. Specifically, the manufacturing method of the present embodiment is as follows. First, referring to FIG. 2 and FIG. 2A, a substrate 110 is provided. In some embodiments of the present disclosure, the substrate 110 is a transparent substrate including a rigid transparent substrate or a flexible transparent substrate, and the material of which may be selected from a transparent material such as glass, polymethylmethacrylate (PMMA), polyvinyl chloride (PVC), polypropylene (PP), polyethylene terephthalate (PET), polyethylene naphthalate (PEN), polycarbonate (PC), polystyrene (PS), and the like.

Figure 3:
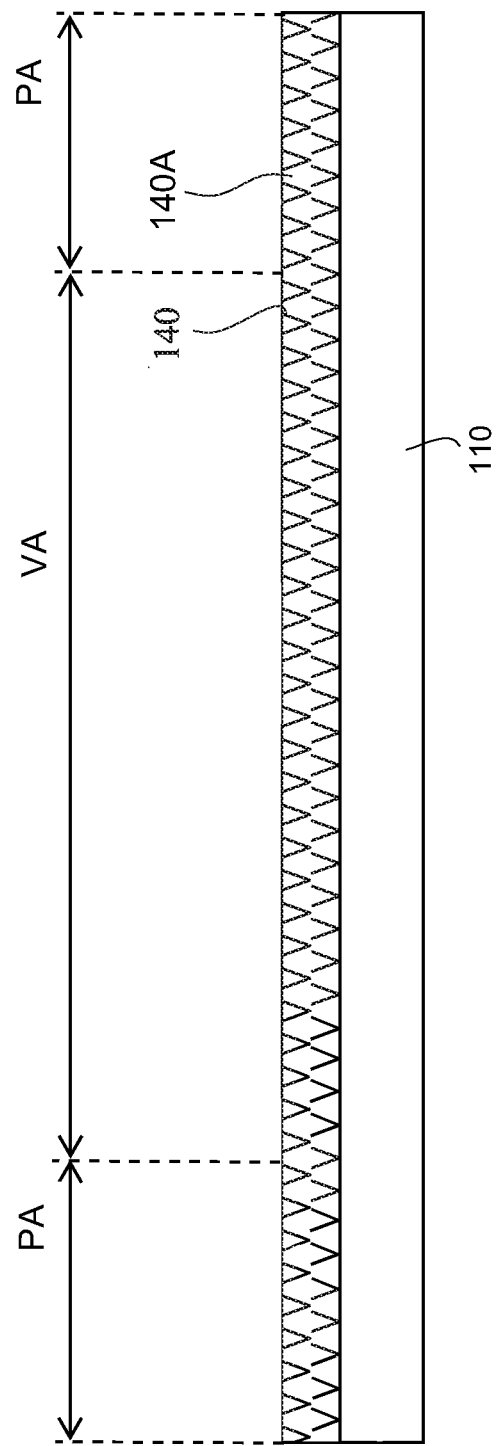
FIG. 3 is a schematic view of step S1 in the manufacturing method of FIG. 1.

Referring to FIG. 3, at step S1, a metal nanowire layer 140A is fabricated on the substrate 110. The metal nanowire layer 140A may at least comprise a plurality of metal nanowires 140. In the present example, the method includes forming a dispersion or ink having the metal nanowires 140 on the substrate 110 by a coating method and then drying the ink/dispersion, such that a surface of the substrate 110 is covered by the metal nanowires 140. In other words, the ink of metal nanowires 140 are subjected to the drying or curing step so as to form the metal nanowire layer 140A on the substrate 110. A display area VA and a peripheral area PA are defined on the substrate 110. The peripheral area PA is disposed on the side of the display area VA. For example, as shown in FIG. 3, the peripheral area PA is disposed in regions that are on the left side and the right side of the display area VA. In another example, however, the peripheral area PA is a frame-shaped region surrounding the display area VA (i.e., surrounding the left side, right side, upper side, and bottom side of the display area VA). Alternatively, the peripheral area PA is an L-shaped region of two adjacent sides of the display area VA. The metal nanowire layer 140A may include a first portion in the display area VA and a second portion in the peripheral area PA. In detail, in the display area VA, the first portion of the metal nanowire layer 140A may be directly formed on a surface of the substrate 110. Similarly, in the peripheral area PA, the second portion of the metal nanowire layer 140A may be formed on a surface of the substrate 110.

In embodiments of the present disclosure, the ink/dispersion may include at least one solvent, which may be water, alcohols, ketones, ethers, hydrocarbons, or an aromatic solvent (such as benzene, toluene, xylene, and the like). The dispersion may include additives, surfactants or adhesives, such as carboxymethyl cellulose (CMC), hydroxyethyl cellulose (HEC), hydroxypropyl methylcellulose (HPMC), sulfonate ester, organosulfate, disulfonate, sulfosuccinic acid ester, organophosphate, or a fluorine-containing surfactant, and the like. The metal nanowires layer may be, for example, a silver nanowire layer, a gold nanowire layer, or a copper nanowire layer. The term "metal nanowire(s)" in the present disclosure is a collective noun that refers to a set of metal wires including a plurality of elemental metals, metal alloys, or metal compounds (including metal oxides). The number of metal nanowires does not limit the scope of the present disclosure. A dimension of at least one cross-sectional area of the metal nanowires (i.e., the diameter of the cross-sectional area) is below 500 nm, preferably below 100 nm or below 50 nm. The so-called "wire(s)" of the metal nanostructure in the present disclosure has a high aspect ratio (i.e., the ratio of the length to the diameter of the cross-sectional area), such as 10 to 100,000. The aspect ratio of the metal nanowires may be greater than 10, or greater than 50 or greater than 100. The metal nanowires may be any metals, including but not limited to silver, gold, copper, nickel, and a silver material coated with gold. Other terms such as "silk," "fiber," or "tube" having a dimension and an aspect ratio within the aforementioned value ranges are also included in the scope of the present disclosure.

The dispersion or ink containing the metal nanowires 140 may be coated on the substrate 110 by a suitable process known in the art, including but not limited to a screen printing process, a spray coating process, or a roller coating process. In one example, the dispersion or ink containing the metal nanowires 140 may be coated on the substrate 110 by using a roll-to-roll process.

In some embodiments of the present disclosure, the metal nanowires 140 may include silver nanowires or silver nanofibers. The metal nanowires 140 may have an average diameter of about 20 nm to 100 nm and an average length of about 20 μm to 100 μm (i.e., the aspect ratio is about 1000). In one embodiment, the metal nanowires 140 may have an average diameter of about 20 nm to 70 nm and an average length of about 20 μm to 70 μm. In some embodiments, the average diameter of the metal nanowires 140 ranges from 70 nm to 80 nm, and the average length of the metal nanowires 140 is about 8 μm.

Figure 4:
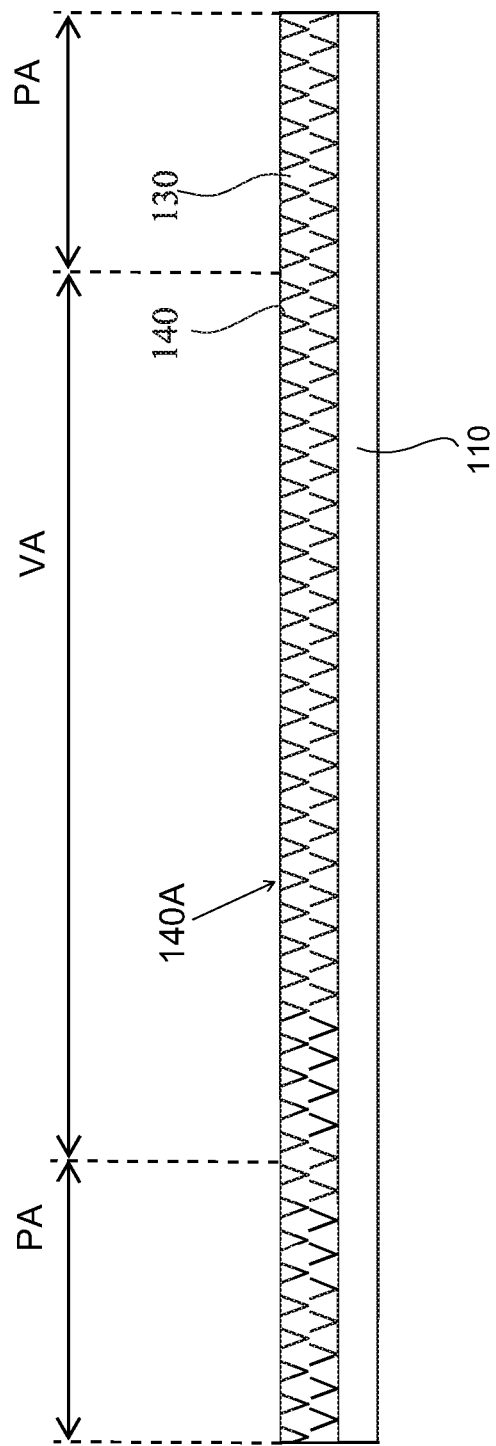
FIG. 4 is a schematic view of step S2 in the manufacturing method of FIG. 1.

Next, referring to FIG. 4, at step S2, a photosensitive layer 130 is disposed on the metal nanowire layer 140A. The approach for forming a suitable polymer or a mixture thereof onto the substrate 110 may include but not limited to a coating method. Then a curing step (or drying step) is performed to form the photosensitive layer 130 on the metal nanowire layer 140A. In detail, the photosensitive layer 130 includes a first portion in the display area VA and a second portion in the peripheral area PA. The first portion of the photosensitive layer 130 is correspondingly formed on the first portion of the metal nanowire layer 140A. The second portion of the photosensitive layer 130 is correspondingly formed on the second portion of the metal nanowire layer 140A. In another example, when a suitable polymer or a mixture thereof is costed on the substrate 110, the polymer may permeate or penetrate into spaces between the metal nanowires 140 to form a filler or a matrix. Then, a curing step is performed to form a composite layer including the metal nanowires 140 and the photosensitive layer 130. In other words, the metal nanowires 140 can be considered to be embedded in the photosensitive layer 130. In one example, a pre-curing step, for example a heating or a baking step (under a temperature of about 60° C. to about 150° C.) is performed, such that the polymer or the mixture thereof is partially cured or pre-cured as the photosensitive layer 130 on the metal nanowire layer 140A. In other words, the photosensitive layer 130 can be fully cured or partially cured before a photolithography step S4. The physical structure of the photosensitive layer 130 and the metal nanowire layer 140A is not limited in the present disclosure. For example, the photosensitive layer 130 and the metal nanowire layer 140A may be a double-layered lamination. Alternatively, the photosensitive layer 130 and the metal nanowire layer 140A may be combined with each other to integrally form a composite layer. In an embodiment, the metal nanowires 140 are embedded in the photosensitive layer 130, such that a composite electrode layer (which is referred to as "composite structure (CS)" hereinafter) is formed in the subsequent process. FIG. 4 shows a composite structure including the photosensitive layer 130 and the metal nanowires 140 in both display area VA and peripheral area PA.

In one example, the photosensitive layer 130 is formed by a photosensitive resin and can be patterned by an exposure and developing process. For example, the photosensitive layer 130 is a photoresist material with negative photosensitivity. In another example, the photosensitive layer 130 may be a photoresist material with positive photosensitivity.

In one embodiment, examples of the polymer forming the photosensitive layer 130 may include, but not limited to polyacrylic resins, such as polymethacrylates (for example, polymethylmethacrylate), polyacrylates, and polyacrylonitrile; polyvinyl alcohol; polyester (for example, polyethylene terephthalate (PET), polyester naphthalate, and polycarbonate); a polymer having a high aromaticity, such as phenolic resins, cresol-formaldehyde, polystyrene, polyvinyl toluene, polyvinylxylene, polyimide, polyamide, polyamideimide, polyetherimide, polysulfide, polysulfone, polyphenylene, and polyphenylene ether; polyurethane (PU); epoxy resin; polyolefins (for example, polypropylene, polymethylpentene, and cycloolefins); cellulose; polysilicone and other silicon-containing polymers (for example, polysilsesquioxanes and polysilanes); polyvinyl chloride (PVC); polyacetate ester; polynorbornene; synthetic rubber (for example, ethylene-propylene rubber (EPR), styrene-butadiene rubber (SBR), ethylene-propylene-diene monomer (EPDM) and fluorine-containing polymers (for example, polyvinylidene fluoride, polytetrafluoroethylene (TFE) or polyhexafluoropropylene)); a copolymer of fluorine-olefins and hydrocarbon olefin, and other similar non-conductive polymers. A photosensitive material may be added in the polymer to meet the requirement of patterning the photosensitive layer 130 by an exposure and developing process. In other examples, an inorganic material may be mixed with the photosensitive material to form the photosensitive layer 130. For example, the inorganic material may be silica, mullite, alumina, SiC, carbon fibers, MgO—$Al_2O_3$—$SiO_2$, $Al_2O_3$—$SiO_2$, MgO—$Al_2O_3$—$SiO_2$—$Li_2O$, or the like.

In addition, preferably, the polymer may provide some certain chemical properties, mechanical properties and optical properties of the composite structure CS of the photosensitive layer 130 and the metal nanowires 140. For example, the polymer may provide adhesion between the composite structure CS and the substrate 110, or improved mechanical strength. Therefore, the photosensitive layer 130 is also referred to as "matrix". Moreover, the photosensitive layer 130 may be made of certain types of polymers, such that the composite structure CS may have additional surface protection, such as scratch resistance and abrasion resistance. In this case, the photosensitive layer 130 is also referred to as "overcoat" (OC). In one embodiment, the composite structure CS is made of epoxy resins, polyurethanes, polysilanes, polysiloxanes, poly(silicon-acrylic), and the like, such that the surface strength of the composite structure CS is higher, thereby increasing the scratch resistance thereof. Furthermore, a crosslinking agent, a polymerization inhibitor, a stabilizer (such as antioxidant or UV stabilizer, but not limited thereto), a surfactant, a mixture thereof, or the like may be added in the photosensitive layer 130 or the polymer to increase the UV-resistance or the durability of the composite structure CS. In other examples, the photosensitive layer 130 may further include a corrosion inhibitor. However, the description above merely provides some possible additives of the photosensitive layer 130, as well as their compositions, additional functions and names, but the present disclosure is not limited thereto. It is noted that since the UV light stabilizer may be added in the photosensitive polymer, the precision of the subsequent exposing and developing that are performed on the photosensitive layer 130 may be influenced by the UV light stabilizer. However, in the present disclosure, the influence of the UV light stabilizer on exposure precision is reduced by adjusting parameters, such as exposure intensities, in the exposing process.

Figure 5:
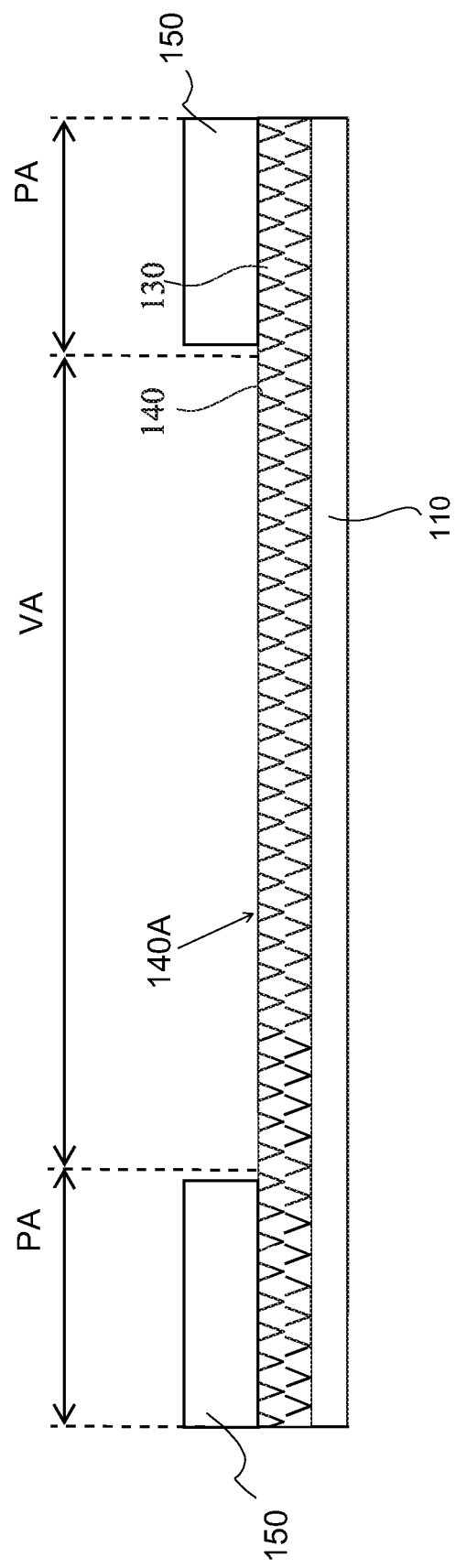
FIG. 5 is a schematic view of step S3 in the manufacturing method of FIG. 1.

Next, referring to FIG. 5, at step S3, a photosensitive conductive layer 150 is disposed in the peripheral area PA. As shown in FIG. 5, the photosensitive conductive layer 150 is disposed on the composite structure CS of the photosensitive layer 130 and the metal nanowires 140. The photosensitive conductive layer 150 is located substantially in the peripheral area PA, but may also extend from the peripheral area PA to the display area VA.

In one example, the photosensitive conductive layer 150 is formed of a photosensitive conductive material and can be patterned by an exposure and developing process. For example, the photosensitive conductive layer 150 is a silver paste (Ag paste) material with negative photosensitivity, but is not limited thereto.

In one example, the approach of disposing the photosensitive conductive layer 150 in the peripheral area PA may include, but not limited to coating the silver paste material on the peripheral area PA, and then curing the silver paste material to form the photosensitive conductive layer 150. In one example, a photo curing or a thermal curing is performed. For example, the temperature in the curing step of the silver paste material is about 90° C. to 110° C., and the curing time is about 10 to 20 minutes.

In one example, the photoresist material of the photosensitive layer 130 and the silver paste material of the photosensitive conductive layer 150 may be cured in the same step. In other words, the photoresist material of the photosensitive layer 130 may be pre-cured, and then is fully cured during the step of curing or solidifying the silver paste material.

Next, at step S4, a patterning step is performed. In one example, the patterning step may be performed with a photolithography process. Considering the photosensitivity of the photosensitive layer 130 and the photosensitive conductive layer 150, the two layers can be patterned in one photolithography process without an etch step. The photosensitive layer 130 and the photosensitive conductive layer 150 are subjected to treatments of exposure, developing, and the like (or generally referred to as a "photolithography process"), such that the photosensitive conductive layer 150 and the composite structure CS of the photosensitive layer 130 and the metal nanowires 140 are simultaneously patterned. The method includes the following steps: exposing the photosensitive layer 130 and the photosensitive conductive layer 150 to define a reserved region 130A and a removal region 130B (reference is made to FIG. 6A and FIG. 6B). Next, the material (including the metal nanowires 140, the photoresist material of the photosensitive layer 130, or the silver paste material of the photosensitive conductive layer 150) in the removal region 130B are removed for patterning at least one of the composite structure CS and the photosensitive conductive layer 150.

In one example, a photomask with patterns is used to shield the photosensitive layer 130 and the photosensitive conductive layer 150, and an exposure light source (such as UV light) having an exposure energy of about 200 mj/cm$^2$ to about 1500 mj/cm$^2$ is used to transfer the patterns of the photomask onto the photosensitive layer 130 and the photosensitive conductive layer 150. In an embodiment, UV light of about 600 mj/cm$^2$ to about 800 mj/cm$^2$ is used to transfer patterns so as to define the removal region 130B and the reserved region 130A, and an interface between the removal region 130B and the reserved region 130A is formed. Next, the photosensitive layer 130 and the metal nanowire layer 140A on the removal region (e.g., a first removal region) 130B of the display area VA are removed by a developer or a developing solution (or a film-release agent or a stripper) to fabricate a touch sensing electrode TE. Meanwhile, the photosensitive conductive layer 150, the photosensitive layer 130, and the metal nanowire layer 140A on the removal region (e.g., a second removal region) 130B of the peripheral area PA are removed by the developer to fabricate a peripheral conductive trace 120 in the peripheral area PA. In addition, the photosensitive layer 130 or the composite structure CS that remains in the display area VA has an exposed sidewall, and the photosensitive conductive layer 150, the photosensitive layer 130, or the composite structure CS that remains in the peripheral area PA also has an exposed sidewall.

In the present example, the photosensitive layer 130 and the photosensitive conductive layer 150 may comprise materials having the same or similar optical band absorption characteristics. For example both photosensitive layer 130 and the photosensitive conductive layer 150 are photosensitive to a G-line or I-line UV light source, and therefore they can be simultaneously exposed by using one exposure light source or by one exposure step. In other words, using an exposure light source to simultaneously emit light onto the photosensitive layer 130 and the photosensitive conductive layer 150 is performed. The photosensitive layer 130 and the photosensitive conductive layer 150 may have the same or similar photosensitivity characteristics, such as they both have negative photosensitivity, but is not limited thereto. Accordingly, the removal region 130B is an unexposed region, and the reserved region 130A is an exposed region. Therefore, in the display area VA, the photosensitive layer 130 in the first removal region 130B may be removed/stripped by the developer (e.g., a developing process), and thus the metal nanowire layer 140A in the first removal region 130B is also removed/stripped by immersion of the developer, such that the touch sensing electrode TE is fabricated. Similarly, in the peripheral area PA, the photosensitive layer 130 and the photosensitive conductive layer 150 in the second removal region 130B may be removed/stripped by the developer, and the metal nanowire layer 140A in the removal region 130B is simultaneously removed during this step, such that the peripheral conductive trace 120 is fabricated. The developing step in the disclosure is a technique well known in the art. Briefly, for the photosensitive material in the photosensitive layer 130 or the photosensitive conductive layer 150, chemical reactions may occur in the portion that is exposed to light and thus forming strong chemical bonds, whereas the portion that is not exposed to light is removed by the developer (in the case of negative photosensitivity).

The photosensitive layer 130 or the photosensitive conductive layer 150 in the removal region 130B may be removed by using xylene ($C_6H_4(CH_3)_2$), butyl acetate, $Na_2CO_3$ in a concentration of about 0.1%-1%, an aromatic hydrocarbon solvent, etc. In other examples, the step of removing the photosensitive conductive layer 150, the photosensitive layer 130, and the metal nanowire layer 140A in the removal region 130B may be performed by using the developer with other solvents.

Accordingly, the photosensitive layer 130 and the metal nanowire layer 140A located in the reserved region 130A may remain for fabrication of the touch sensing electrode TE, so that the touch sensing electrode TE is fabricated by patterning the composite structure CS in the display area VA. The photosensitive conductive layer 150 in the reserved region 130A may remain for fabrication of the peripheral conductive trace, so that the peripheral conductive trace 120 is fabricated by patterning the photosensitive conductive layer 150 in the peripheral area PA. The peripheral conductive trace 120 is formed on the patterned composite structure CS to electrically connect with the touch sensing electrode TE via the metal nanowire layer 140A of the patterned composite structure CS underneath to transmit signals.

Figure 6:
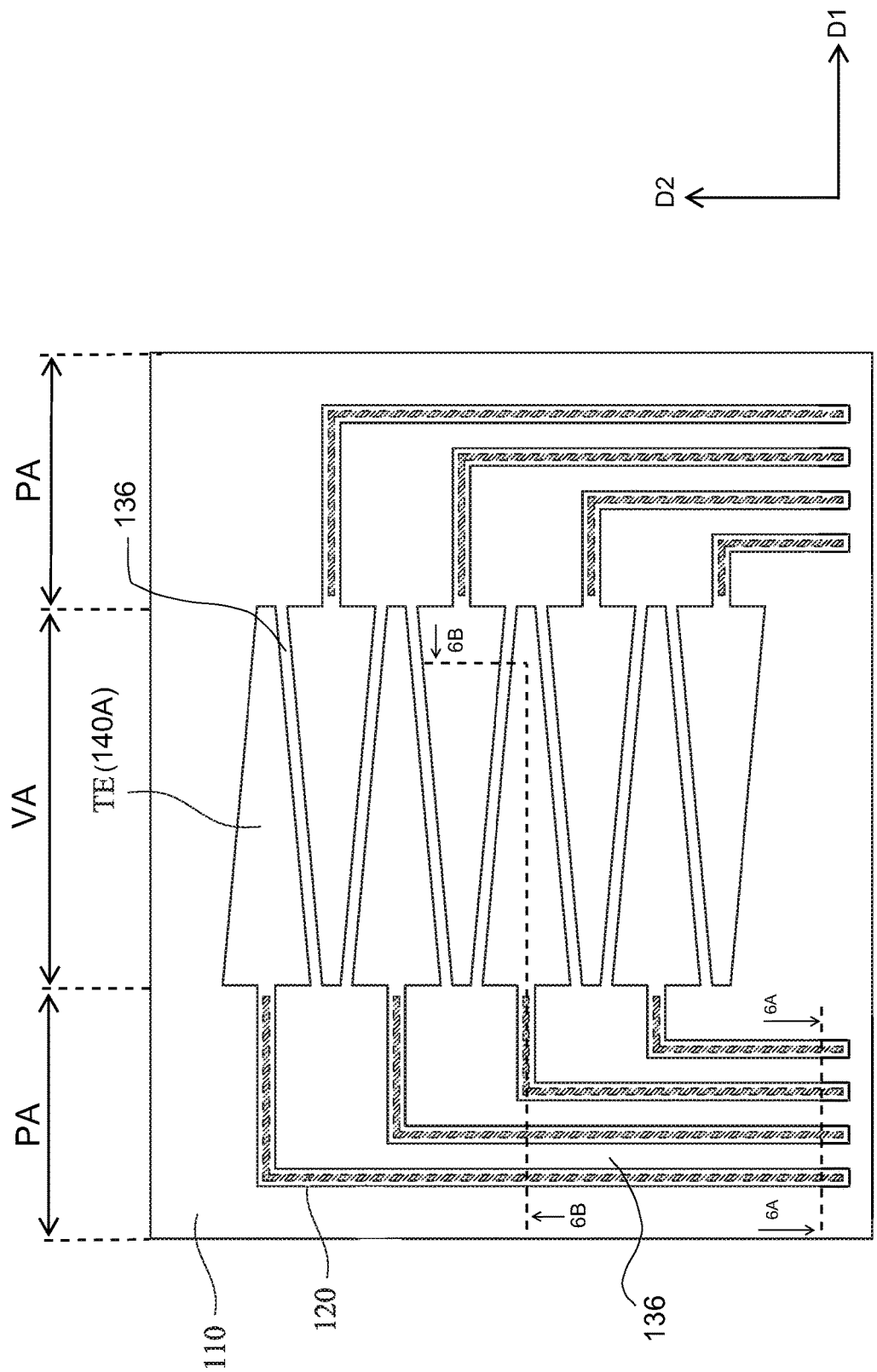
FIG. 6 is a touch panel according to some embodiments of the present disclosure.
Figure 6A:
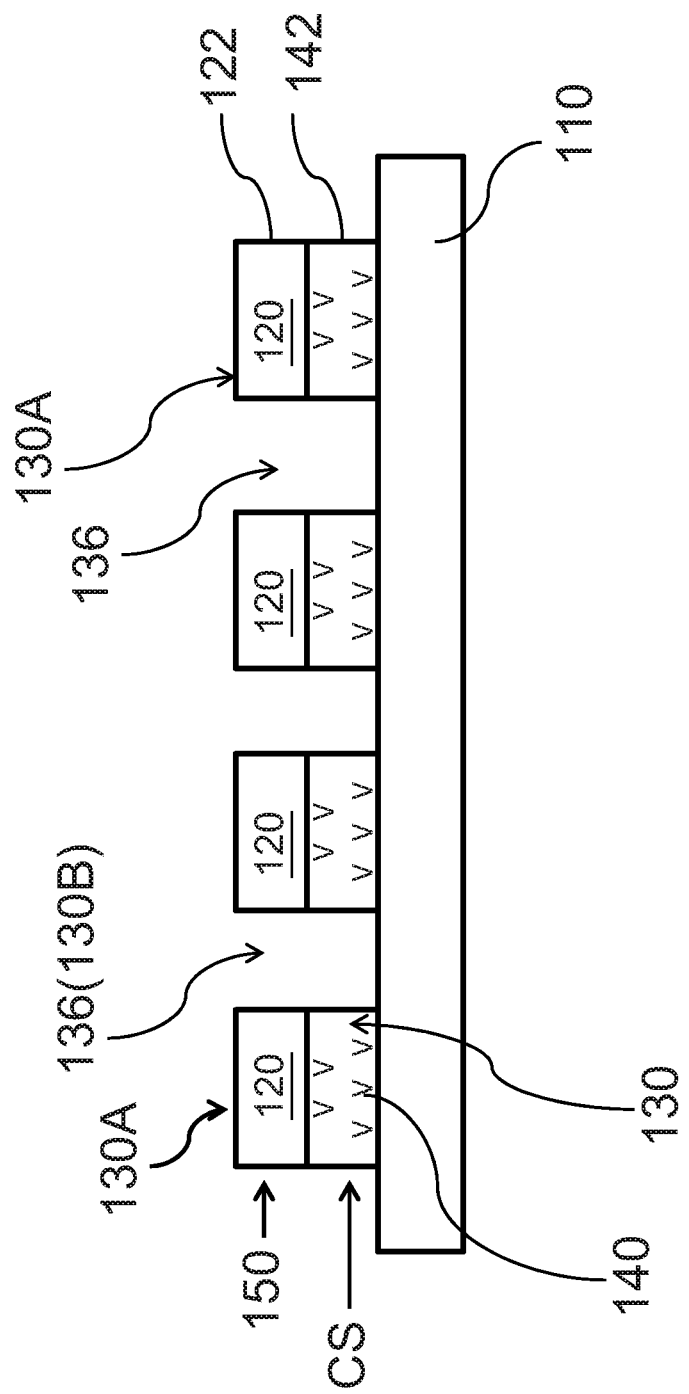
FIG. 6A is a schematic sectional view along line 6A-6A in FIG. 6.
Figure 6B:
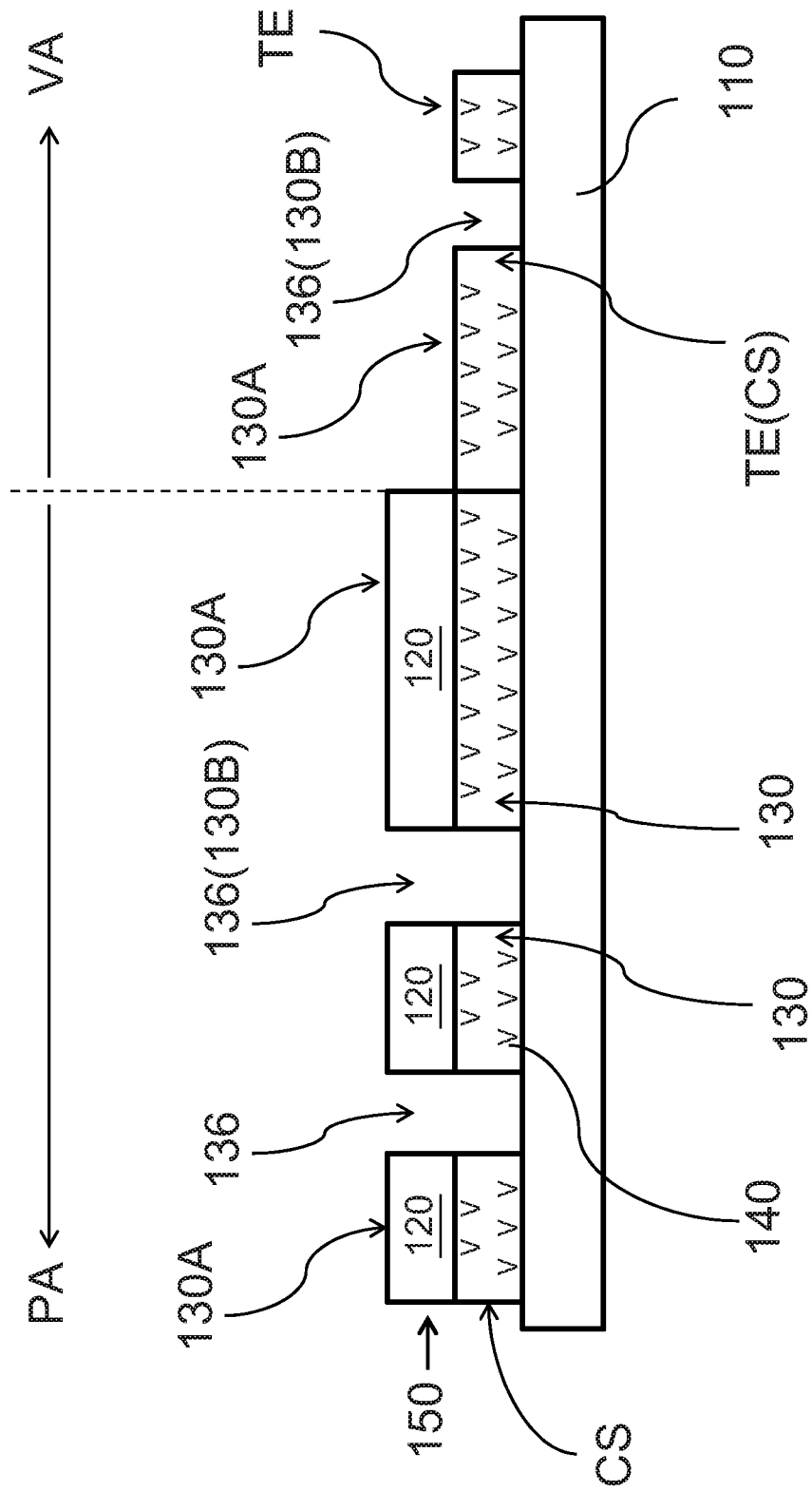
FIG. 6B is a schematic sectional view along line 6B-6B in FIG. 6.

Reference is made to FIG. 6, which shows a touch panel according to one embodiment of the present disclosure. FIG. 6A and FIG. 6B are respectively the profile along line A-A and line B-B in FIG. 6. The A-A profile illustrates details of the reserved region 130A and the removal region 130B in the peripheral area PA. The B-B profile illustrates details of the reserved region 130A and the removal region 130B in the peripheral area PA and the display area VA. As shown in FIG. 6A and FIG. 6B, after the step of exposure and developing process of the photosensitive layer 130 and the photosensitive conductive layer 150 in the peripheral area PA, the second removal region 130B and the reserved region 130A can be defined. The photosensitive layer 130 and the metal nanowire layer 140A (e.g., the composite structure CS), and the photosensitive conductive layer 150 in the removal region 130B are removed to form gaps (i.e., "non-conductive area(s) 136" hereinafter). The photosensitive conductive layer 150 in the reserved region 130A is patterned to form the peripheral conductive trace 120. The composite structure CS under the peripheral conductive trace 120 is also patterned. A non-conductive area 136 is located between the adjacent peripheral conductive traces 120. In addition, a first exposed sidewall 122 of the peripheral conductive trace 120 is aligned with a second exposed sidewall 142 of the composite structure CS. Since the structural layers of the peripheral area PA are patterned in the same step, the conventional alignment step can be omitted, thereby reducing or avoiding the need to reserve an alignment deviation region during the alignment process. Accordingly, the width of the peripheral area PA is reduced, and the narrow frame/border requirements of the touch panel/touch display are met.

As shown in FIG. 6B, in the display area VA, the photosensitive layer 130 and the metal nanowire layer 140A in the reserved region 130A integrally form a transparent conductive layer (i.e., the composite structure CS), which is patterned in the mentioned developing process to form the touch sensing electrode TE. In the present example, the photosensitive layer 130 and the metal nanowire layer 140A (i.e., the composite structure CS) in the removal region 130B are removed to form gap, such that the non-conductive area 136 between the adjacent touch sensing electrodes TE is formed. In addition, the touch sensing electrode TE may be electrically connected to the peripheral conductive trace 120 via the composite structure CS in the peripheral area PA.

In one example, as exemplified by the display area VA, the composite structure CS (i.e., the touch sensing electrode TE) in the reserved region 130A has an exposed sidewall, which can be considered as an interface between the removal region 130B and the reserved region 130A for photochemical reaction. In contrast, in the conventional etching process, the strong acidic etchant may only remove the metal nanowires but not the polymer layer, such as an overcoat. Therefore, in the present disclosure, the photosensitive layer 130 and the metal nanowire layer 140A in the removal region 130B are removed simultaneously to avoid the influence of the residual overcoat on subsequent processes. In one example, the metal nanowires of the metal nanowire layer 140A protrude from the exposed sidewall.

The traditional patterning steps are replaced by the integrated one developing step of this embodiment. In other words, the photosensitive layer 130 and the metal nanowire layer 140A in the removal region 130B of the display area VA are simultaneously removed by the developer to fabricate the touch sensing electrode TE. In addition, the photosensitive conductive layer 150, the photosensitive layer 130, and the metal nanowire layer 140A in the removal region 130B of the peripheral area PA are simultaneously removed to fabricate the peripheral conductive trace 120. It is noted that the present disclosure is not limited thereto, and any processes that do not require using an etching liquid and applying only developing technique to strip off the photosensitive layer 130 or the photosensitive conductive layer 150 and simultaneously patterning the metal nanowire layer 140A is within the scope of the present disclosure.

In one example, as shown in FIG. 6A, the metal nanowires 140 or the metal nanowire layer 140A and the photosensitive layer 130 between the adjacent peripheral conductive traces 120 are entirely removed. In other words, there is no physical material of the metal nanowires 140 and the photosensitive layer 130 between the adjacent peripheral conductive traces 120 after the aforementioned exposure and developing steps. Thus, an insulating region (i.e., a "non-conductive area 136" hereinafter) can be formed between the adjacent peripheral conductive traces 120. In the embodiment, the non-conductive area 136 of the embodiment is a gap structure, and a concentration of the metal nanowires 140 dispersed in the gap structure is zero. Therefore, electrical isolation between the adjacent peripheral conductive traces 120 is achieved, thereby achieving the circuit configuration of the touch panel. In one example, after the photolithography process, the metal nanowires 140 in the non-conductive area 136 can be entirely removed by an auxiliary removal step. For example, after the aforementioned development step, an adhesive tape is used to remove the metal nanowires 140 in the removal region 130B.

Similarly, as shown in FIG. 6B, the position of the removal region 130B in the display area VA corresponds to the insulating region (i.e., the non-conductive area 136)

between the adjacent touch sensing electrodes TE, such that the touch sensing electrodes TE for sensing different touch positions are defined. In other words, the metal nanowires 140 and the photosensitive layer 130 do not exist in the non-conductive area 136 between the adjacent touch sensing electrodes TE. In other words, in the present embodiment, the non-conductive area 136 between the adjacent touch sensing electrode TE is a gap structure, and a concentration of the metal nanowire 140 dispersed in the gap structure is zero.

In the present embodiment, the metal nanowires 140 form a conductive network in the photosensitive layer 130, thereby forming a so-called transparent conductive layer. The patterned transparent conductive layer may be formed as the touch sensing electrodes TE in the display area VA. Considering display performance, the composite structure CS, which is made of the metal nanowires 140 and the photosensitive layer 130, has light transmittance of greater than about 80% and surface resistance of about 10 to 1,000 ohm/square. In an embodiment, the composite structure CS has light transmittance of greater than about 85% and surface resistance of about 50 to 500 ohm/square.

In one example, the thickness of the photosensitive layer 130 is controlled to be sufficiently thin, such that at least a portion of the metal nanowires 140 may expose and protrude from the photosensitive layer 130. For example, the thickness of the photosensitive layer 130 is less than 90 nm, such that at least one of a middle portion (i.e., a body), one end or two ends of the metal nanowires 140 may protrude out of an upper surface of the photosensitive layer 130. In the peripheral area PA, the peripheral conductive trace 120 may form a low-resistance contact with the exposed metal nanowires 140, such that the signal transmission path formed by the touch sensing electrode TE and the peripheral conductive trace 120 may have a high signal-transmission performance.

In an embodiment, the metal nanowires 140 as formed may be further subjected to a post-treatment. The post-treatment may include at least one of heating treatment, plasma treatment, corona discharge treatment, UV ozone treatment or pressurizing treatment. For example, after the step of forming the metal nanowire layer 140A, a roller can be used to apply a pressure thereon. In one example, one or more rollers can be used to apply a pressure of about 50 to 3400 psi, about 100 to 1000 psi, about 200 to 800 psi, or about 300 to 500 psi onto the metal nanowire layer 140A. In some embodiments, post-treatments such as heating and pressurizing may be performed simultaneously. In detail, a pressure may be applied onto the metal nanowires 140 by using one or more rollers, and heating is performed simultaneously. For example, the pressure applied by the roller may be about 10 to 500 psi, or 40 to 100 psi, and the roller may be heated to about 70° C. to 200° C., or about 100° C. to 175° C. In some embodiments, the metal nanowires 140 are preferably exposed to a reducing agent during the post-treatment. For example, the metal nanowires 140 of silver nanowires are exposed to a reducing agent for silver material during the post-treatments. The reducing agent for silver includes boron hydride such as sodium boron hydride, boron nitrides such as dimethylaminoborane (DMAB), or a gas reducing agent such as hydrogen ($H_2$). The exposure time is about 10 seconds to about 30 minutes, or about 1 minute to about 10 minutes. The step of applying pressure can be carried out before or after the step of coating the photosensitive layer 130, based on actual needs. The post-treatment is used to increase the properties thereof, such as conductivity of the composite structure CS.

In summary, the embodiments of the present disclosure can be used for a touch panel for touch sensing. The touch panel may include the touch sensing electrodes TE (i.e., the composite structure CS formed of the photosensitive layer 130 and the metal nanowires 140) in the display area VA of the substrate 110 and the peripheral conductive traces 120 formed in the peripheral area PA of the substrate 110. The touch sensing electrode TE and the peripheral conductive trace 120 are electrically connected to each other for transmitting signals. The peripheral conductive trace 120 is fabricated by patterning the photosensitive conductive layer 150. In the present example, the composite structure CS formed of the photosensitive layer 130 and the metal nanowires 140 may extend from the display area VA to the peripheral area PA and is patterned together with the photosensitive conductive layer 150 in the same developing step. In detail, in the peripheral area PA, the peripheral conductive trace 120 is formed on the composite structure CS, and they have corresponding patterns. More specifically, the peripheral conductive trace 120 and the composite structure CS located in the peripheral area PA have the same or similar patterns after the photolithography process, and the peripheral conductive trace 120 and the composite structure CS in the peripheral area PA may have exposed sidewalls. In an embodiment, the exposed sidewall 122 of the peripheral conductive trace 120 is aligned with the corresponding exposed sidewall 142 of the composite structure CS to form a coplanar plane.

As shown in FIG. 6, the touch panel of the present embodiment is a single-sided, non-cross type touch panel. The number of the touch sensing electrode TE can be one or more. In detail, the display area VA has a plurality of touch sensing electrodes TE extending in the same direction (such as a first direction D1), and the non-conductive area 136 defined by the removal region 130B in the aforementioned process is located between the adjacent touch sensing electrodes TE. Similarly, the peripheral area PA also has a non-conductive area 136 defined by the removal region 130B to electrically insulate the adjacent peripheral conductive traces 120. In the touch panel of the present embodiment, the composite structure CS, which is formed of the photosensitive layer 130 and the metal nanowires 140, and the photosensitive conductive layer 150 can be directly patterned without using an etchant. The touch sensing electrode TE in the display area VA may serve for sensing the user's touch position or gesture, and the peripheral conductive trace 120 in the peripheral area PA is electrically connected to the touch sensing electrode TE to transmit the sensing signal detected by the touch sensing electrode TE to an external controller (not shown). The conducting lines in the peripheral area PA may form a stack-up structure of the photosensitive silver paste layer and the composite layer of silver nanowires and polymer material.

The present disclosure provides a second manufacturing method, which differs from the aforementioned method at least in that the metal nanowires 140 of the non-conductive area 136 are not entirely removed by the photolithography process in the present method. In other words, the metal nanowires 140 remain in the removal region 130B, but a concentration of the remaining metal nanowires 140 is lower than a percolation threshold, and the photosensitive layer 130 in the removal region 130B is entirely removed by the exposure and developing step described above. The conductivity of the composite structure formed of the photosensitive layer 130 and the metal nanowires 140 is primarily controlled by the following factors: a) the conductivity of the single metal nanowire 140, b) the number of the metal nanowires 140, and c) the connectivity (also referred to as "contact") between the metal nanowires 140. If the concentration of the metal nanowires 140 is lower than the percolation threshold, because the distance between the metal nanowires 140 is too far, and therefore the overall conductivity of the removal region 130B is very low, or even equal to zero (or having a high resistance). That is, the metal nanowires 140 does not provide a continuous current path in the removal region 130B, and therefore the metal nanowires 140 are unable to form a conductive network. In other words, the metal nanowires 140 form a non-conductive network in the non-conductive area 136. In one example, the sheet resistance of a region or a structure in the following range can be considered as non-conductive: a sheet resistance higher than $10^8$ ohm/square, or higher than $10^4$ ohm/square, or higher than 3000 ohm/square, or higher than 1000 ohm/square, or higher than 350 ohm/square, or higher than 100 ohm/square. In other words, the gap between the adjacent peripheral conductive trace 120 in the embodiment is filled with the metal nanowires 140 in a concentration lower than the percolation threshold, which form a non-conductive network to achieve insulation between the adjacent peripheral conductive traces 120. Similarly, the gap between the adjacent touch sensing electrodes TE is filled with the metal nanowires 140 in a concentration lower than the percolation threshold, which form a non-conductive network to achieve insulation between the adjacent touch sensing electrodes TE.

The present disclosure also provides a third manufacturing method, which differs from the aforementioned method at least in that the metal nanowire layer 140A of the present method may contain photosensitive additives, such that the photosensitive layer 130 can be omitted in the present method. Details of the method are as follows. First, a dispersion or an ink having the metal nanowires 140 and photosensitive additives is formed on the substrate 110 by a coating method and then drying the same, such that a surface of the substrate 110 is covered by the metal nanowires 140. In other words, the metal nanowires 140 will form the metal nanowire layer 140A disposed on the substrate 110 by the aforementioned drying and curing steps, and the metal nanowire layer 140A contains photosensitive additives therein. The photosensitive additives may include a radical type unsaturated oligomer, such as a polyester acrylic resin, an epoxy acrylic resin, etc. The photosensitive conductive layer 150 is then disposed on the metal nanowire layer 140A in the peripheral area PA. Details of this step have been described above, and therefore are not repeated herein. Next, a patterning step is performed: using the photosensitive additives in the metal nanowire layer 140A, the metal nanowire layer 140A on the display area VA is patterned by the exposure and developing step described above to form the touch sensing electrode TE. Meanwhile, the photosensitive conductive layer 150 and the metal nanowire layer 140A on the peripheral area PA are also patterned by the exposure and developing step, such that the peripheral conductive trace 120 is fabricated on the peripheral area PA. Details of the patterning step of the present embodiment have been described above, and therefore are not repeated herein. In summary, in the method of the present embodiment, the photosensitive additives are added to the metal nanowire layer 140A, such that the metal nanowire layer 140A is photo-sensitive and thereby can be patterned in the exposure and developing step. In one example, the metal nanowire layer 140A, which is photo-sensitive, can also be combined with the aforementioned photosensitive layer 130 to enhance the overall characteristics of the metal nanowire layer 140A, such as strength, acid and alkali resistance, scratch resistance, and the like.

In addition to the single-sided touch panel, the process of the present disclosure can also be applied to a double-sided touch panel. For example, the metal nanowire layer 140A and the photosensitive layer 130 are fabricated on opposite sides of the substrate 110, and the photosensitive conductive layer 150 is then formed on opposite sides of the substrate 110 according to the aforementioned method. A double-sided exposure and developing process and the like is then performed to form a patterned touch sensing electrode TE and a patterned peripheral conductive trace 120 on opposite sides of the substrate 110. Similar to the foregoing embodiment, the steps of the present embodiment can be integrated into one development step. The photosensitive layer 130 and the metal nanowire layer 140A in the removal region 130B of the display area VA on both sides of the substrate 110 are simultaneously removed by using a developer to fabricate the touch sensing electrode TE. The photosensitive conductive layer 150, the photosensitive layer 130, and the metal nanowire layer 140A in the removal region 130B of the peripheral area PA are simultaneously removed to fabricate the peripheral conductive trace 120.

In one example, in order to avoid the mutual interference of the photosensitive layer 130 and the photosensitive conductive layer 150 on opposite sides of the substrate 110 during exposure, a light source with different time sequences may be used in the exposure process. In another example, light sources of different wavelengths may be used in the exposure process. In other words, the photosensitive layer 130 on the opposite sides of the substrate 110 is a material sensitive to light sources of different wavelengths, and the photosensitive conductive layer 150 is also a material sensitive to light sources of different wavelengths. In another example, a light beam blocking layer (not shown) may be formed on opposite sides of the substrate 110, followed by the formation of the metal nanowire layer 140A, the photosensitive layer 130 and the photosensitive conductive layer 150. Specifically, the light beam blocking layer is a UV blocking layer. The photosensitive layer 130 and the photosensitive conductive layer 150 on opposite sides of the substrate 110 may be photosensitive to a light source with the same or similar wavelength. Therefore, the same UV light source can be used in the exposure and developing process for patterning. The UV blocking layer is capable of absorbing a portion of the UV light with a particular wavelength (for example, at least 10%, 20%, 25%, or 20%-50% of the total energy) while substantially allowing transmission of visible light (for example, with a wavelength of 400-700 nm), such as visible light greater than 85% of the total energy. In one example, the UV blocking layer is a PET film of Teijin DuPont Films under the product name "HB3-50" with a thickness of 50 μm. Another exemplified UV blocking layer is a PET film of Teijin DuPont Films under the product name "XST6758" with a thickness of 125 μm.

Figure 7:
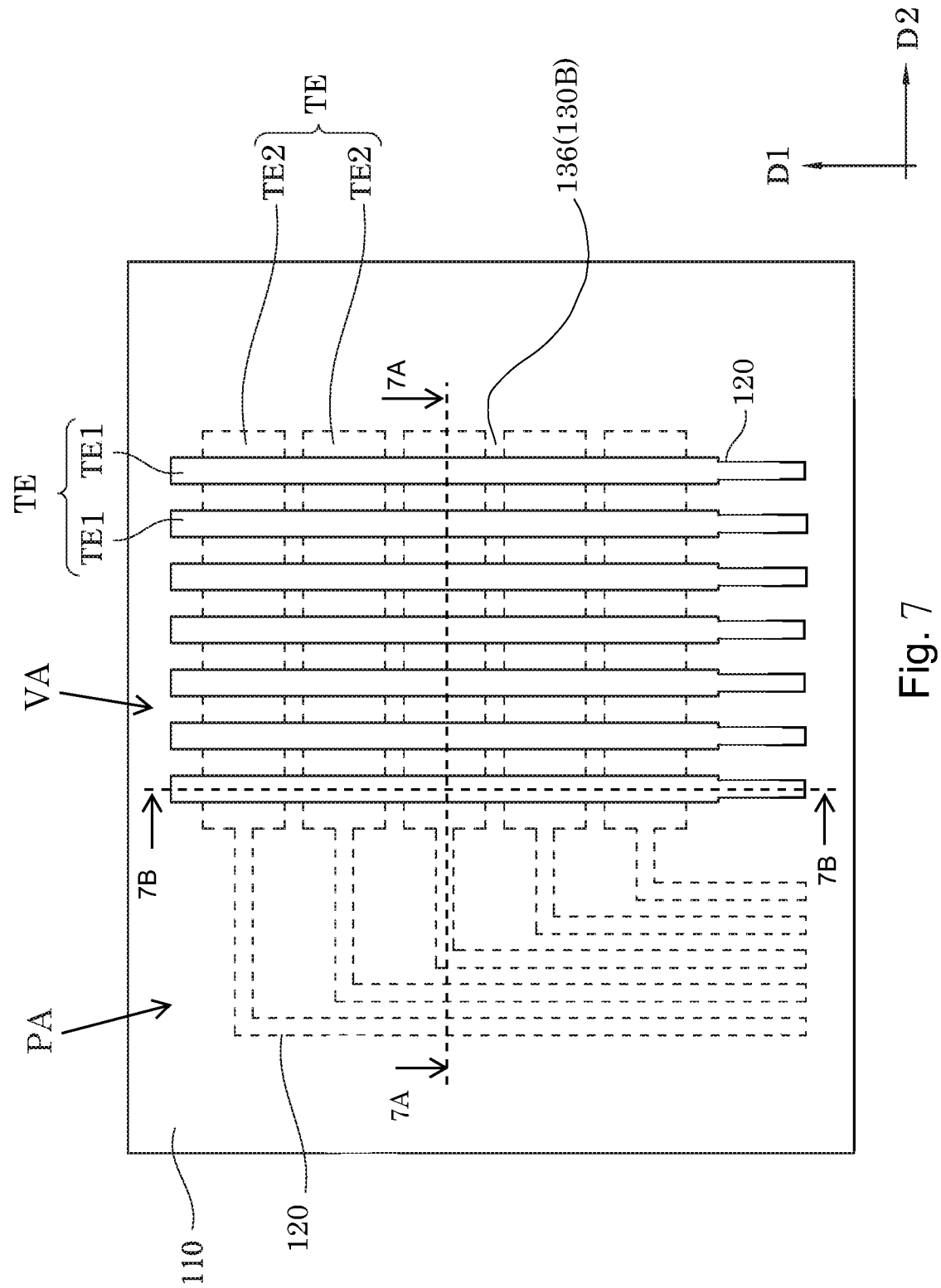
FIG. 7 is a touch panel according to another embodiment of the present disclosure.
Figure 7A:
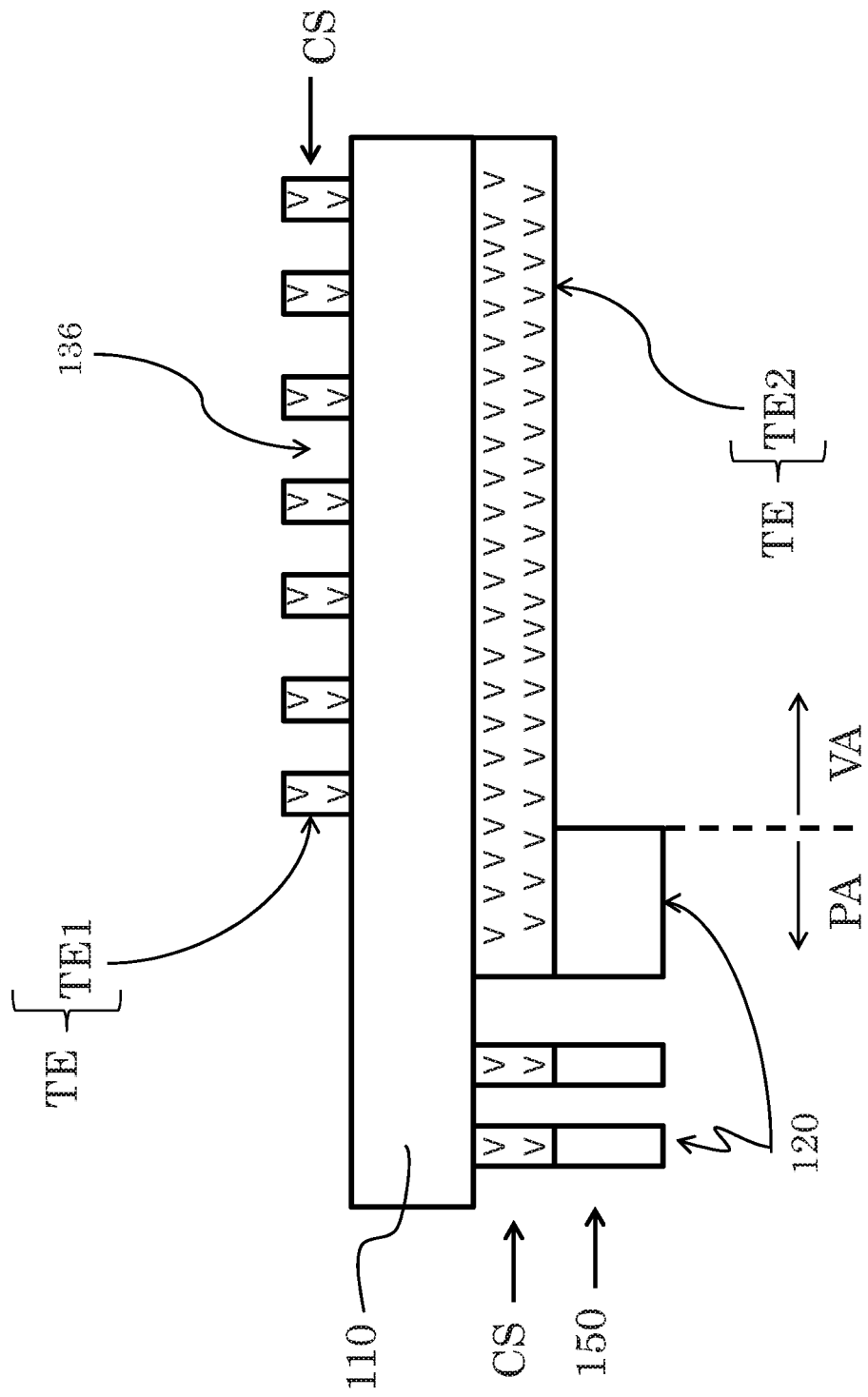
FIG. 7A is a schematic sectional view along line 7A-7A in FIG. 7.

Reference is made to FIG. 7, which shows a double-sided touch panel of the embodiment of the present disclosure. Reference is also made to the sectional views of FIG. 7A. As viewed from the upper surface of the substrate 110, the patterning step can be described as follow. In the display area VA, the composite structure CS is patterned by a photolithography process to form the first touch sensing electrode TE1. Meanwhile, in the peripheral area PA, the photosensitive conductive layer 150 and the composite structure CS in the peripheral area PA are patterned by a photolithography process to form the peripheral conductive trace 120. The peripheral conductive trace 120 is electrically connected to the first touch sensing electrode TE1. In one example, the first touch sensing electrode TE1 is substantially located in the display area VA and may include multiple long strip-shaped sensing electrodes extending along the same direction (such as the first direction D1). The removal region can be defined as a non-conductive area 136 which electrically isolates the adjacent sensing electrodes. In one example, the peripheral conductive trace 120 and the composite structure CS thereunder substantially have the same patterns, and they have sides or edges that are aligned with each other (i.e., exposed sidewalls) as a coplanar sidewall.

Figure 7B:
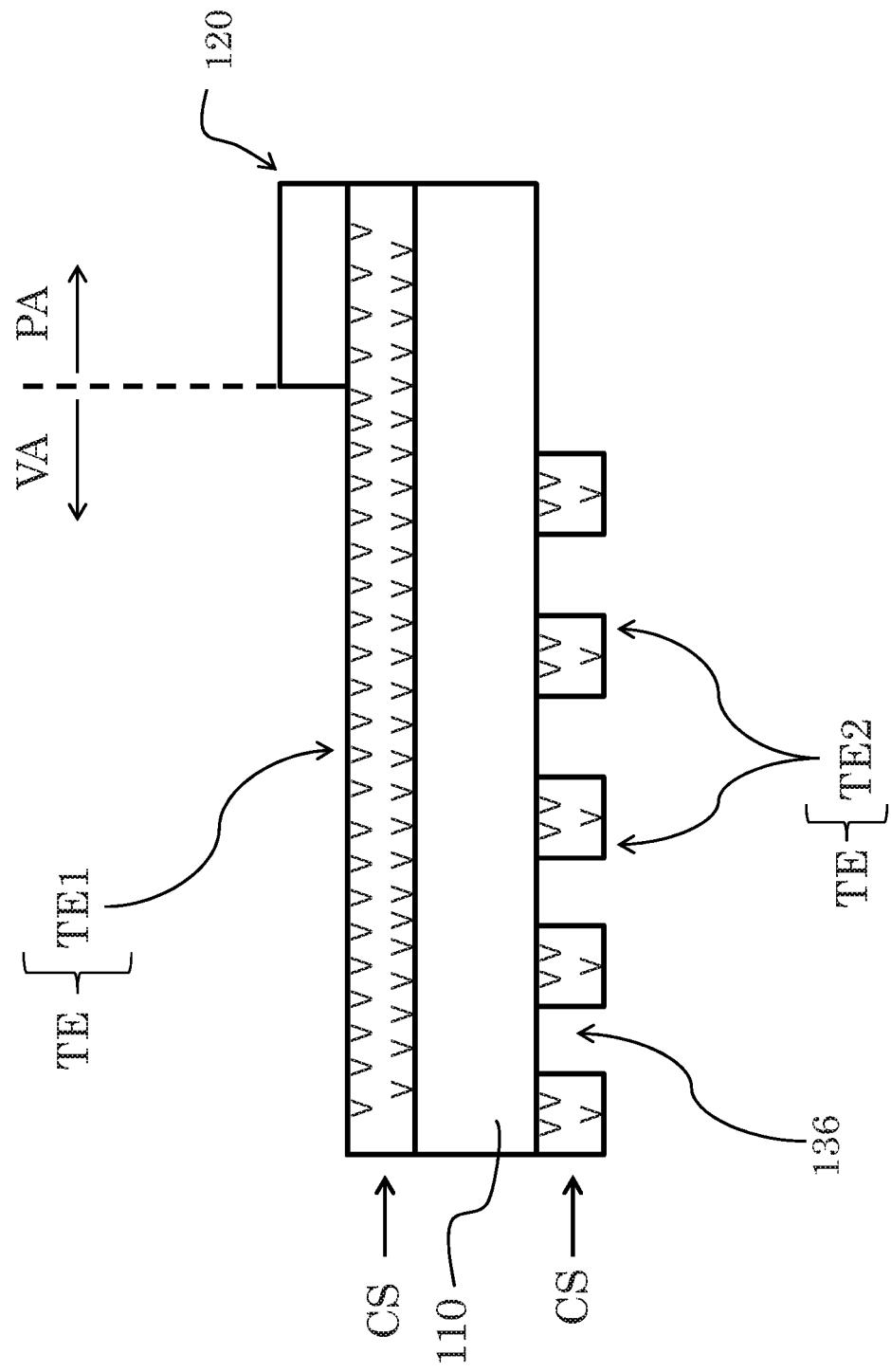
FIG. 7B is a schematic sectional view along line 7B-7B in FIG. 7.

Similarly, reference is made to sectional views of FIG. 7 and FIG. 7B. As viewed from the lower surface of the substrate 110, the patterning step can be described as follow. In the display area VA, the composite structure CS is patterned by a photolithography process to form the second the touch sensing electrode TE2. Meanwhile, in the peripheral area PA, the photosensitive conductive layer 150 and the composite structure CS in the peripheral area PA are patterned by a photolithography process to form the peripheral conductive trace 120. The peripheral conductive trace 120 is electrically connected to the second touch sensing electrode TE2. In one example, the second touch sensing electrode TE2 is substantially located in the display area VA and may include multiple long strip-shaped sensing electrodes extending along the same direction (such as the second direction D2). The removal region can be defined as a non-conductive area 136 which electrically blocks the adjacent sensing electrodes. In one example, the peripheral conductive trace 120 and the composite structure CS thereunder substantially have the same patterns, and they have sides or edges that are aligned with each other (i.e., exposed sidewalls).

The first touch sensing electrode TE1 and the second touch sensing electrode TE2 are interlaced in structure, and they can form the touch sensing electrode TE for sensing touching or control gestures.

In some embodiments of the present disclosure, an etching liquid/etchant is not required. Instead, during the patterning process (i.e., exposure and developing) of the photosensitive layer 130 or the photosensitive conductive layer 150, the transparent conductive layer comprising the metal nanowire layer 140A and the photosensitive layer 130 is also patterned to form the touch sensing electrode TE in the display area, thereby eliminating the need of an etching liquid during the conventional etching step of the metal nanowire layer 140A. Accordingly, problems caused by the residue of the etching liquid are solved, thereby increasing the production yield.

In some embodiments of the present disclosure, no etching liquid is required for etching the metal nanowire layer 140A, thereby eliminating the influence of etching liquid on components (such as the peripheral conductive trace 120 made of a metal material).

In some embodiments of the present disclosure, using the photosensitivity of the photosensitive layer 130 and/or the photosensitive conductive layer 150, the metal nanowire layer 140A is patterned in an approach that involves photochemical reaction and the use of developer for removal. Therefore the conventional etching step of the metal nanowire layer 140A can be omitted, thereby simplifying the overall process to achieve cost reduction.

In some embodiments of the present disclosure, by direct contact between the photosensitive conductive layer 150 and the metal nanowires 140 in the metal nanowire layer 140A, a low-impedance conductive pathway can be formed, thereby reducing the loss and distortion in transmission of the touch signal.

In some embodiments of the present disclosure, the photosensitive layer 130 can provide the desired protection to the metal nanowire layer 140A, thereby allowing the product to pass a more stringent resistance test.

In some embodiments of the present disclosure, the durability of the touch sensing electrode of the display area can be increased by the protection provided by the photosensitive layer 130.

In some embodiments of the present disclosure, by designing the peripheral leads and the underlying metal nanowire layer to be patterned in the same step, an alignment step can be omitted. Accordingly, there is no need to reserve an alignment error region during the alignment process, and thereby effectively reducing the width of the peripheral area.

In some embodiments of the present disclosure, the method can simultaneously produce a single-sided or double-sided touch panel in a large number of batches.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of manufacturing a touch panel, comprising:
providing a substrate having a display area and a peripheral area;
disposing a metal nanowire layer comprising a plurality of metal nanowires in the display area and the peripheral area;
disposing a photosensitive layer on the metal nanowire layer,
wherein the photosensitive layer is made of a photoresist material comprising a polymer or a mixture of polymer, and
wherein the disposal of the photosensitive layer on the metal nanowire layer comprising:
allowing the photoresist material to permeate or penetrate into spaces between the metal nanowires in the metal nanowire layer, and
curing the photoresist material of the photosensitive layer to form a composite layer of the photosensitive layer and the metal nanowire layer, such that the metal nanowires of the metal nanowire layer are embedded in the photosensitive layer;
disposing a photosensitive conductive layer in the peripheral area; and
performing a photolithography step, comprising:
exposing the photosensitive layer and the photosensitive conductive layer to define a removal region and a reserved region; and
removing the photosensitive layer and the metal nanowire layer in the removal region by using a developer to fabricate a touch sensing electrode on the display area; and
removing the photosensitive conductive layer, the photosensitive layer, and the metal nanowire layer in the removal region by using the developer to fabricate a peripheral conductive trace on the peripheral area, the touch sensing electrode electrically connected to the peripheral conductive trace, wherein the touch sensing electrode comprises the photosensitive layer and the metal nanowire layer.

2. The method of claim 1, wherein the photosensitive conductive layer comprises a silver paste with a negative photosensitivity.

3. The method of claim 2, further comprising a curing step for curing the silver paste of the photosensitive conductive layer and the photosensitive layer simultaneously;
wherein the curing of the photoresist material of the photosensitive layer to form a composite layer of the photosensitive layer and the metal nanowire layer is a pre-curing step.

4. The method of claim 1, wherein
the photosensitive layer and the photosensitive conductive layer comprise materials having the same or similar optical band absorption characteristics, and
the exposing the photosensitive layer and the photosensitive conductive layer comprises using an exposure light source to simultaneously emit light onto the photosensitive layer and the photosensitive conductive layer.

5. The method of claim 1, further comprising using an adhesive tape to remove the metal nanowires in the removal region.

6. The method of claim 1, wherein at least a portion of the metal nanowires protrudes out of the photosensitive layer.

7. A touch panel, comprising:
a substrate having a display area and a peripheral area;
a photosensitive layer and a metal nanowire layer comprising a plurality of metal nanowires disposed on the substrate,
wherein the photosensitive layer is made of a photoresist material comprising a polymer or a mixture of polymer, and
wherein the disposal of the photosensitive layer and the metal nanowire layer on the substrate comprising:
allowing the photoresist material to permeate or penetrate into spaces between the metal nanowires of the metal nanowire layer, and
curing the photoresist material of the photosensitive layer to form a composite layer of the photosensitive layer and the metal nanowire layer, such that the metal nanowires of the metal nanowire layer are embedded in the photosensitive layer; and
a photosensitive conductive layer disposed on the peripheral area,
wherein a first removal region is defined on the display area and a second removal region is defined on the peripheral area after an exposure,
wherein, in the display area, the photosensitive layer and the metal nanowire layer in the first removal region are removed by a developer, such that a touch sensing electrode is formed in the display area, and in the peripheral area, the photosensitive conductive layer, the photosensitive layer, and the metal nanowire layer in the second removal region are removed by the developer, such that a peripheral conductive trace is formed in the peripheral area, and
wherein the touch sensing electrode is electrically connected to the peripheral conductive trace.

8. The touch panel of claim 7, wherein the photosensitive conductive layer comprises a silver paste with a negative photosensitivity.

9. The touch panel of claim 7, wherein the photosensitive layer and the photosensitive conductive layer comprise materials having the same or similar optical band absorption characteristics.

10. The touch panel of claim 7, wherein
the metal nanowire layer comprises a plurality of metal nanowires, and
at least a portion of the metal nanowires protrudes out of the photosensitive layer.

11. The touch panel of claim 7, wherein
a non-conductive area is located in the first removal region and between the touch sensing electrode and another touch sensing electrode, and
a concentration of metal nanowires of the metal nanowire layer in the non-conductive area is zero.

12. The touch panel of claim 7, wherein
a non-conductive area is located in the second removal region and between the peripheral conductive trace and another peripheral conductive trace, and
a concentration of metal nanowires of the metal nanowire layer in the non-conductive area is zero.

13. The touch panel of claim 7, wherein
a non-conductive area is located between the touch sensing electrode and another touch sensing electrode, and
a concentration of metal nanowires of the metal nanowire layer in the non-conductive area is less than a percolation threshold, such that the metal nanowires in the non-conductive area form a non-conductive network.

14. The touch panel of claim 7, wherein
a non-conductive area is located between the peripheral conductive trace and another peripheral conductive trace, and
a concentration of metal nanowires of the metal nanowire layer in the non-conductive area is less than a percolation threshold, such that the metal nanowires in the non-conductive area form a non-conductive network.

15. The touch panel of claim 7, wherein the touch sensing electrode has an exposed sidewall.

16. The touch panel of claim 7, wherein
the peripheral conductive trace is disposed on a composite structure comprising the photosensitive layer and the metal nanowire layer,
the peripheral conductive trace has a first exposed sidewall,
the composite structure has a second exposed sidewall, and
the first exposed sidewall is coplanar with the second exposed sidewall.

17. A touch panel, comprising:
a substrate having a display area and a peripheral area;
a photosensitive layer and a metal nanowire layer disposed on the substrate,
wherein the photosensitive layer is made of a photoresist material comprising a polymer or a mixture of polymer, and
wherein the disposing of the photosensitive layer and the metal nanowire layer on the substrate comprising:
allowing the photoresist material to permeate or penetrate into spaces between metal nanowires of the metal nanowire layer, and
curing the photoresist material of the photosensitive layer to form a composite layer of the photosensitive layer and the metal nanowire layer, such that metal nanowires of the metal nanowire layer are embedded in the photosensitive layer; and a photosensitive conductive layer disposed on the peripheral area;

wherein a first non-conductive region is defined on the display area and a second non-conductive region is defined on the peripheral area after an exposure;

wherein, in the display area, a concentration of metal nanowires in the metal nanowire layer in the first non-conductive region is lower than a percolation threshold, such that a touch sensing electrode is formed in the display area;

wherein, in the peripheral area, a concentration of metal nanowires in the metal nanowire layer in the second non-conductive region is lower than the percolation threshold, such that a peripheral conductive trace is formed in the peripheral area; and wherein the touch sensing electrode is electrically connected to the peripheral conductive trace.

18. The method of claim 1, wherein the disposal of the metal nanowire layer in the display area and the peripheral area comprising coating and drying a dispersion or ink having the metal nanowires and photosensitive additives on the substrate.

19. The method of claim 1, wherein the substrate is having a first side and a second side, and each of the first and second sides is having the display area and the peripheral area;

wherein the disposal of the metal nanowire layer in the display area and the peripheral area is performed on both sides of the substrate;

wherein the disposal of the photosensitive layer on the metal nanowire layer is performed on both sides of the substrate;

wherein the disposal of the photosensitive conductive layer in the peripheral area is performed on both sides of the substrate;

wherein the photolithography step is performed on both sides of the substrate simultaneously, the photolithography step comprising:

exposing the photosensitive layer and the photosensitive conductive layer in defining the removal region and the reserved region on the first side of the substrate using a light source with a first time sequence; and exposing the photosensitive layer and the photosensitive conductive layer in defining the removal region and the reserved region on the second side of the substrate using a light source with a second time sequence, the second time sequence is different from the first time sequence; and wherein the removal of the photosensitive conductive layer, the photosensitive layer, and the metal nanowire layer in the removal region is performed on both sides of the substrate.

20. A double-sided touch panel manufactured by the method of claim 19.

* * * * *